United States Patent
Van Den Brink et al.

(10) Patent No.: US 8,248,583 B2
(45) Date of Patent: Aug. 21, 2012

(54) LITHOGRAPHIC APPARATUS AND CALIBRATION METHOD

(75) Inventors: Marinus Aart Van Den Brink, Moergestel (NL); Hans Butler, Best (NL); Emiel Jozef Melanie Eussen, Eindhoven (NL); Engelbertus Antonius Fransiscus Van Der Pasch, Oirschot (NL); Marc Wilhelmus Maria Van Der Wijst, Veldhoven (NL); Georgo Angelis, Heesch (NL); Renatus Gerardus Klaver, Eindhoven (NL); Martijn Robert Hamers, 's-Hertogenbosch (NL); Boudewijn Theodorus Verhaar, Eindhoven (NL); Peter Hoekstra, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 808 days.

(21) Appl. No.: 12/367,193

(22) Filed: Feb. 6, 2009

(65) Prior Publication Data

US 2010/0007867 A1 Jan. 14, 2010

Related U.S. Application Data

(60) Provisional application No. 61/006,970, filed on Feb. 8, 2008.

(51) Int. Cl.
*G03B 27/52* (2006.01)
(52) U.S. Cl. ............ 355/77; 355/72; 355/75; 356/400; 356/401; 310/12.06
(58) Field of Classification Search .............. 355/72, 355/75, 77; 356/400, 401; 310/12.06
See application file for complete search history.

(56) References Cited

U.S. PATENT DOCUMENTS

| | | | |
|---|---|---|---|
| 6,686,991 | B1 | 2/2004 | Binnard et al. |
| 7,256,871 | B2 * | 8/2007 | Loopstra et al. ............... 355/72 |
| 7,408,617 | B2 * | 8/2008 | Van Der Pasch et al. ....... 355/53 |
| 7,561,270 | B2 * | 7/2009 | Kwan ........................... 356/400 |
| 7,852,033 | B2 * | 12/2010 | Matsui ......................... 318/625 |
| 2002/0039694 | A1 * | 4/2002 | Scheiberlich et al. .......... 430/30 |
| 2005/0219500 | A1 * | 10/2005 | Matsui ............................ 355/72 |
| 2005/0274878 | A1 | 12/2005 | Goldman et al. |
| 2006/0023178 | A1 * | 2/2006 | Loopstra et al. ................ 355/53 |

(Continued)

FOREIGN PATENT DOCUMENTS

JP 05-343282 A 12/1993

(Continued)

OTHER PUBLICATIONS

English language translastion of Japanese Notice of Reasons for Rejection directed to related Japanese Application No. 2009-021061, mailed Jul. 1, 2011 from the Japanese Patent Office; 4 pages.

(Continued)

*Primary Examiner* — Thomas R Artman
(74) *Attorney, Agent, or Firm* — Sterne, Kessler, Goldstein & Fox P.L.L.C

(57) ABSTRACT

In an embodiment, a stage system calibration method includes moving the stage relative to an encoder grid in response to a setpoint signal and measuring a position of the stage by a sensor head cooperating with the encoder grid. The position of the stage is controlled by a stage controller. A signal representative of a difference between the setpoint signal and the position of the stage as measured by the sensor head is registered. The stage system is calibrated from the registered signal representative of the difference.

18 Claims, 2 Drawing Sheets

U.S. PATENT DOCUMENTS

| | | | |
|---|---|---|---|
| 2006/0023194 A1* | 2/2006 | Loopstra et al. | 355/72 |
| 2006/0139660 A1* | 6/2006 | Patrick Kwan | 356/614 |
| 2006/0290914 A1* | 12/2006 | Van Der Pasch et al. | 355/67 |
| 2009/0040488 A1* | 2/2009 | Shibazaki | 355/55 |
| 2009/0051892 A1* | 2/2009 | Shibazaki et al. | 355/72 |

FOREIGN PATENT DOCUMENTS

| | | |
|---|---|---|
| JP | 2002-151405 A | 5/2000 |
| JP | 2005-284867 A | 10/2005 |
| JP | 2006-054452 A | 2/2006 |
| JP | 2007-071874 A | 3/2007 |
| JP | 2007-180553 A | 7/2007 |
| WO | WO 2007/083758 A1 | 7/2007 |

OTHER PUBLICATIONS

English language abstract of JP 2005-284867 A, published Oct. 13, 2005; 1 page.

English language translation of Korean Office Action directed to related Korean Application No. 10-2009-0009715, filed Feb. 6, 2009, mailed Nov. 10, 2010 from the Korean Intellectual Property Office; 3 pages.

\* cited by examiner

LITHOGRAPHIC APPARATUS AND CALIBRATION METHOD

CROSS-REFERENCE TO RELATED APPLICATIONS

The present application claims the benefit of U.S. Provisional Patent Application No. 61/006,970, filed Feb. 8, 2008, which is incorporated by reference herein in its entirety.

BACKGROUND

1. Field

Embodiments of the present invention relate to a method for calibrating a stage system, a stage system and a lithographic apparatus including such stage system.

2. Background

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In stage systems, such as lithographic apparatus stage systems, a position sensor may be applied to measure a position of the stage. Encoder-type measurement systems may be applied for such position measurement. Thereto, use may be made of a grid (also referred to as grating), such as a one or two dimensional grid, grid plate, etc, and a sensor head cooperating with the grid. Due to its manufacturing process, the grating may not be ideal and may incorporate deviations. Calibration of grid errors in the position sensor system may be performed by a so called "fishbone" technique, whereby a pattern is projected repetitively onto the substrate at different mutual locations, and afterwards the distances between the patterns are measured to compare them with the intended distances between the patterns. A measured difference relates to the error in the measurement system at the location of the exposure. By determining these differences over the complete working range of the position sensor, an error compensation value can be determined for a large number of locations on the measurement system, that, when applied, corrects the measurement system errors. Commonly, however not exclusively limited thereto, use is made of overlapping or adjacent patterns, such as line patterns, which may in some setups provide fishbone-like patterns. It will be understood that this calibration technique can however apply to any type of pattern.

The fishbone calibration technique may only be able to calibrate errors in the grid plate having a low spatial frequency, i.e. errors which change relatively gradually when moving the stage and grid plate relative to each other and having a spatial frequency in a frequency range related to the repetition pattern according to the fishbone technique or below. Inaccuracies or other effects that lead to errors at a higher spatial frequency may be difficult or impossible to detect by the above fishbone technique.

SUMMARY

A calibration accuracy of the stage position measurement may be enhanced.

According to an embodiment of the invention, there is provided a stage system calibration method, including moving, in response to a setpoint signal, the stage relative to an encoder grid, a position of the stage being controlled by a stage controller; measuring during the moving a position of the stage by a sensor head cooperating with the encoder grid; registering a signal representative of a difference between the setpoint signal and the position of the stage as measured by the sensor head; and calibrating the stage system from the registered signal representative of the difference.

In another embodiment of the invention, there is provided a stage system including a movable stage; an encoder grid and a sensor head configured to measure a position of the stage relative to the encoder grid; and a controller configured to position, in response to a setpoint signal, the movable stage relative to the encoder grid; register a signal representative of a difference between the setpoint signal and the position of the movable stage as measured by the sensor head; and calibrate the stage system from the registered signal representative of the difference.

According to a further embodiment of the invention, there is provided a lithographic apparatus including an illumination system configured to condition a beam of radiation; a patterning device support configured to hold a patterning device, the patterning device configured to pattern the beam of radiation to form a patterned beam of radiation; a substrate support configured to support a substrate; a projection system configured to project the patterned beam of radiation onto the substrate, and a stage system configured to move one of the supports, the stage system including a movable stage to hold the one of the supports; an encoder grid and a sensor head configured to measure a position of the movable stage relative to the encoder grid; and a controller configured to i) position, in response to a setpoint signal, the movable stage relative to the encoder grid; ii) register a signal representative of a difference between the setpoint signal and the position of the movable stage as measured by the sensor head; and iii) calibrate the stage system from the registered signal representative of the difference.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
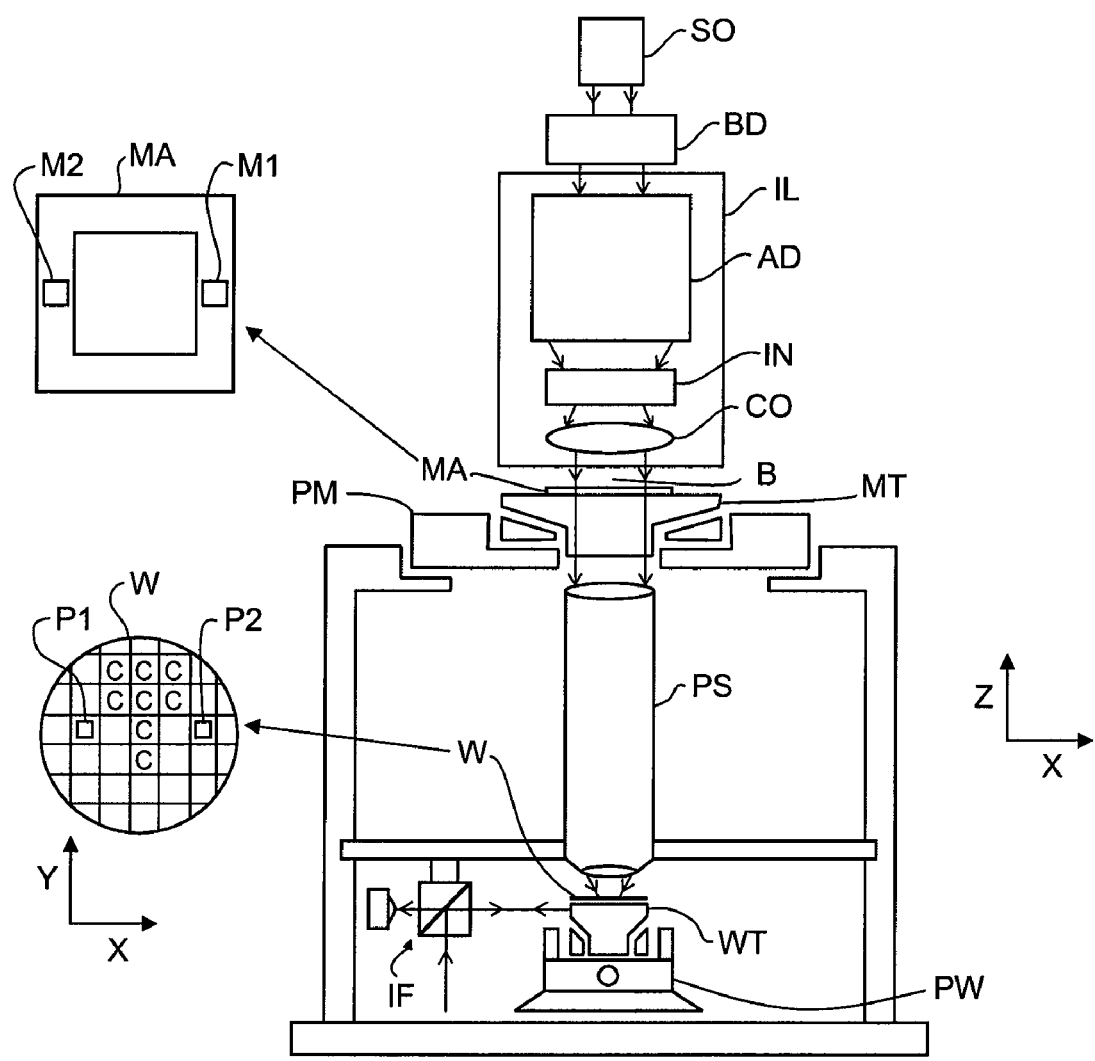
FIG. 1 depicts a lithographic apparatus in which an embodiment of the invention may be provided.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander.

In other cases the source may be an integral part of the lithographic apparatus, for example when the source is a mercury lamp. Source SO and illuminator IL, together with the beam delivery system BD if required, may be referred to as a radiation system.

Illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on patterning device (e.g., mask) MA, which is held on patterning device support (e.g., mask table) MT, and is patterned by the patterning device. Having traversed patterning device (e.g. mask) MA, radiation beam B passes through projection system PS, which focuses the beam onto a target portion C of substrate W. With the aid of second positioning device PW and position sensor IF (e.g. an interferometric device, linear encoder or capacitive sensor), substrate table WT can be moved accurately, e.g. so as to position different target portions C in the path of radiation beam B. Similarly, first positioning device PM and another position sensor (which is not explicitly depicted in FIG. 1) can be used to accurately position patterning device (e.g. mask) MA with respect to the path of radiation beam B, e.g. after mechanical retrieval from a mask library, or during a scan. In general, movement of patterning device support (e.g. mask table) MT may be realized with the aid of a long-stroke module (coarse positioning) and a short-stroke module (fine positioning), which form part of first positioning device PM. Similarly, movement of substrate table WT or "substrate support" may be realized using a long-stroke module and a short-stroke module, which form part of second positioner PW. In the case of a stepper (as opposed to a scanner) patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, patterning device support (e.g. mask table) MT or "mask support" and substrate table WT or "substrate support" are kept essentially stationary, while an entire pattern imparted to the radiation beam is projected onto a target portion C at one time (i.e. a single static exposure). Substrate table WT or "substrate support" is then shifted in the X and/or Y direction so that a different target portion C can be exposed. In step mode, the maximum size of the exposure field limits the size of the target portion C imaged in a single static exposure.

2. In scan mode, patterning device support (e.g. mask table) MT or "mask support" and substrate table WT or "substrate support" are scanned synchronously while a pattern imparted to the radiation beam is projected onto a target portion C (i.e. a single dynamic exposure). The velocity and direction of substrate table WT or "substrate support" relative to patterning device support (e.g. mask table) MT or "mask support" may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, patterning device (e.g. mask table) MT or "mask support" is kept essentially stationary holding a programmable patterning device, and substrate table WT or "substrate support" is moved or scanned while a pattern imparted to the radiation beam is projected onto a target portion C. In this mode, generally a pulsed radiation source is employed and the programmable patterning device is updated as required after each movement of substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
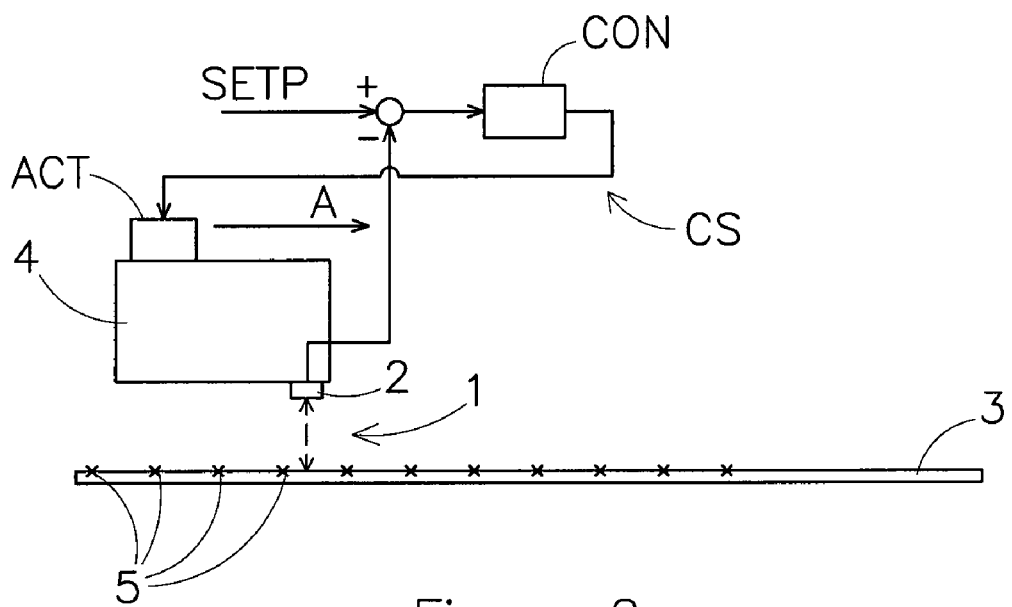
FIG. 2 depicts a schematic view of a stage system of the lithographic apparatus shown in FIG. 1 in accordance with an embodiment of the invention.

FIG. 2 shows schematically an encoder-type position measurement system 1 including an encoder-type sensor head 2 and a grid plate 3 in a 1 dimensional (1-D) situation. Grid plate 3 is a plate on which one or more one-dimensional gratings may be provided. Also, a two dimensional grating may be provided on the grid plate, which may cooperate with a 1-D, 2-D (horizontal+horizontal, horizontal+vertical) or even 3-D sensor. Sensor head 2 is mounted on a sensor object 4, for instance a stage such as a substrate stage or a patterning device stage. The substrate stage is configured to move the substrate table or support and the patterning device stage is configured to move the patterning device support. Position measurement system 1 is configured to measure the position of the sensor object with respect to the grid plate in at least one degree of freedom.

The grating of grid plate 3 can only be manufactured with a certain accuracy. The manufacturing accuracy of conventional grid plates may not be sufficient to obtain the desired measuring accuracy. In order to increase the accuracy obtained during position measurement, grid plate 3 is calibrated. Such calibration may be carried out by a so-called fishbone technique in which in an area around each calibration location 5 a number of calibration measurements are made to measure any disturbances such as fabrication errors in the grid plate. In such fish-bone technique, two spaced-apart marks are imaged, and consequently the marks are again imaged at a staggered position wherein the first image of the first mark and the second image of the second mark in principle should be spaced apart by a small, fixed distance. By comparing the position of the imaged marks and comparing with the intended small space between them, the deviation in the position measurement of the stage between the first and second exposure position may be determined.

The calibration data may be incorporated in a correction map, a so-called metrology map, which is used during actual measurement to take disturbances into account.

However, the density of calibration locations may be limited as a certain area is desired around a calibration location. For instance, when an accuracy of approximately 0.1 nm is desired, a grid spacing, i.e. the distance between adjacent calibration locations, of about 1-5 mm is desired. Furthermore, with increasing requirements on the accuracy of the measurements, this calibration grid spacing may not be sufficient to obtain the desired accuracy during actual position measurement. For instance to obtain a 0.1 nm accuracy during actual position measurement, it is desirable to calibrate the same grid plate 3 with a grid spacing of about 0.4 mm. Thus, errors of the gridplate at a high spatial frequency, i.e. having a short spatial periodicity relative to the distance between the fishbone calibration locations, may not be completely detected and taken into account by the above fishbone calibration technique.

Although a reference has been made to the fishbone calibration technique in the above, it will be appreciated that any suitable calibration technique may be applied.

In an embodiment of the invention, a calibration method is used in which the density of calibration locations may be further increased. According to this embodiment, measurements are made with the encoder-type sensor head 2 at a number of locations, e.g. between two calibrated locations 5, whereby sensor object 4 is moved in the indicated direction (arrow A) with a certain speed over the grid plate. The speed may be selected such that disturbances in grid plate 3 substantially extending over a distance smaller than a distance between two calibrated locations 5 can not or only partly be followed by sensor object 4. As a result, calibration data may be obtained as will be explained hereinafter.

Sensor object 4 is controlled by a control system CS including controller CON which is provided with a difference between a (position) setpoint signal SETP and a sensor output signal of the sensor head 2. An output signal of the controller CON is provided as a drive signal to an actuator ACT to drive sensor object 4 relative to grid plate 3, thereby providing a closed loop control system.

Figure 3:
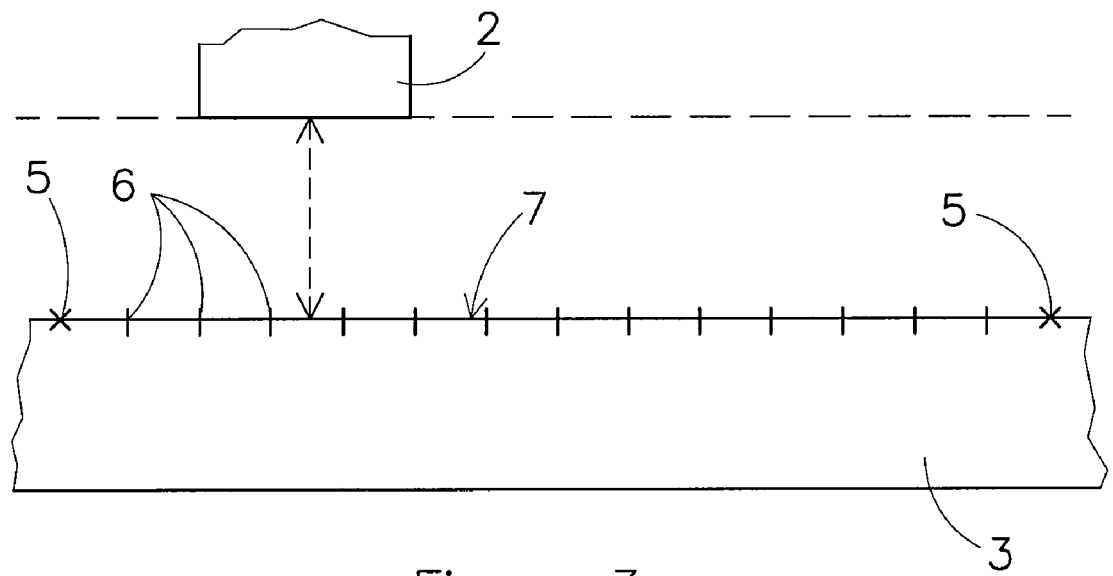
FIG. 3 depicts a schematic view of a stage system of the lithographic apparatus shown in FIG. 1 in accordance with an embodiment of the invention.

In FIG. 3, a part of grid plate 3 of FIG. 2 is shown including two calibrated locations 5. Calibrated locations 5 are obtained by a calibration method capable of measuring only low spatial frequencies, i.e. a relatively large calibration grid spacing. As explained above, it may be desirable to increase the number of calibration locations. When sensor object 4 is controlled to move relative to grid plate 3, the sensor may measure, at a number of locations 6 between the two calibrated locations, the position of sensor head 2 with respect to grid plate 3. The speed of the sensor object and the bandwidth of controller CON to control the position of sensor object 4 are selected such that the sensor object is substantially not capable of following disturbances in the grid plate substantially extending over a distance smaller than a distance between the two calibrated locations 5. This incapability to follow disturbances having a relatively small spatial distance (or high spatial frequency) may further be caused by the inertia of the sensor object. Therefore, a patterning device stage or substrate stage, which is relatively heavy, may be suitable as a sensor object. In that case, the controller may be formed by a (patterning device or substrate) stage controller.

When a disturbance 7 (such as for example an irregularity in the pattern of the grid) exists at one or more of calibration locations 6, sensor head 2 measures a position which does not correspond with the real position at which the sensor object travels along grid plate 3, since controller CON of sensor object 4 may not be capable to adapt the position of the sensor object to follow the disturbance. The difference between the measured position as provided by sensor head 2 and the intended position as provided by setpoint signal SETP can be taken from a suitable signal in the control system, such as an input signal and/or output signal of controller CON to thereby provide a signal representative of a difference between the setpoint signal and the position of the stage as measured by the sensor head of the encoder measurement system. This difference provides data which can be registered in a suitable memory. In this way calibration data is obtained along the movement of the sensor object, for a plurality of calibration locations 6 therewith increasing the density of calibration locations relative to the fishbone technique.

In contrast, if the disturbance extends over a larger number of calibration locations 5, the controller in the control system adapts the position of the sensor object so that the measured position and the controller setpoint would be the same which would cause the difference to disappear.

In an embodiment, the speed of the sensor object is selected to be minimally the bandwidth of controller CON multiplied by the distance between the two adjacent calibrated locations 5. When the speed is determined in this way the sensor object may substantially not be able to follow the disturbances in the grid plate.

In general, the speed of the sensor object may be chosen as high as possible, while still allowing sensor head 2 to measure the position at desired calibration locations 6.

In practice, the bandwidth of the control loop of a stage may for instance be about 200 Hz. Assuming a distance between calibrated locations 5 of about 5 mm, sensor object 4 may not be able to follow any disturbances smaller than about 5 mm when the speed of the sensor object is about 1 m/s. When the sample frequency of the sensor is about 20 kHz the sensor may obtain a measurement each about 0.05 mm. The bandwidth of the stage controller, and hence a bandwidth of the stage control system, may be low compared to a rate (speed) with which the to be calibrated irregularities are sensed, so as to arrange that any possible movement of the stage in order to follow an irregularity in the grid is suppressed at least to some extent as the time duration of the irregularity is short compared to the dynamic behavior of the sensor object controlled by the controller.

The bandwidth of the control loop of the sensor object may be adjustable. In an embodiment, the bandwidth may be lowered to decrease the ability of the sensor object to follow disturbances in the grid plate substantially extending over a distance smaller than a distance between the two calibrated locations. By lowering the bandwidth of the control loop of the sensor object, the sensor object may be less capable of following disturbances in the grid plate. In this way the desired speed of the sensor object may be lowered therewith making a lower calibration grid spacing possible with the same sample frequency of sensor head 2. In practice, the bandwidth may be chosen, for example, at least a factor of 10 smaller than the lowest frequency occurring in the grid errors, to ensure that the response of the controlled sensor object is small enough to ensure that the deviation between the control setpoint and the measured position is a good representation of the measurement grid error.

In an embodiment, a method according to the invention is preceded by a low spatial frequency calibration procedure before the method can be carried out. This low spatial frequency calibration method may be a fishbone like method as described above or any other suitable calibration method. After the low spatial frequency calibration procedure is carried out, the spaces between adjacent calibration locations may be calibrated with a method in accordance with an embodiment of the present invention. The calibration data of the low spatial frequency calibration procedure and the high spatial frequency calibration procedure carried out in an embodiment may be incorporated in separate metrology maps or in a common metrology map. These maps are then used to compensate the position measurement errors in normal operation. Alternatively, the low spatial frequency calibration procedure is carried out after a method according to an embodiment of the invention. In that case, the method according to an embodiment also records low-frequency errors in the gridplate that should be removed by high-pass or band-pass filtering.

To take into account any noise in the measurements, multiple measurements may be made, which measurement results may be averaged. The multiple measurements may be made while the sensor object travels along the grid plate in the same or in other directions. In general, it is remarked that although in FIGS. 2 and 3 the calibration movement is only shown in one direction, the method may be used for the whole grid plate wherein for each position in the x and y direction a value for the x, y and z errors in the grid plate may be determined and stored in a metrology map.

Embodiments of the present method may also be used to find and correct disturbances due to defects in the grid plate. For this application, it may be desirable to use a dense calibration grid having for example a grid spacing of about 0.1 mm or smaller.

A benefit of the calibration method according to an embodiment of the present invention is that the method may be carried out by the position measurement system of a lithographic apparatus (the stage system of respectively the lithographic apparatus including the stage system e.g. being programmed with suitable program instructions in order to carry out the method). As a result, the calibration of the grid plate may be performed after the mounting of the grid plate in the lithographic apparatus. Thus, any errors in the grid plates during this mounting, such as damages during the arrangement of the grid plate in the lithographic apparatus may be taken into account during calibration.

Furthermore, the grid plate may periodically be (re-)calibrated without the need to take the grid plate out of the lithographic apparatus to calibrate it in a separate calibration device. It may be beneficial to periodically calibrate the grid plate since, due to thermal or mechanical reasons, errors may come into existence on the grid plate as well as particles such as dust particles may come to rest on the grid plate. By periodically re-calibrating the grid plate, such changes may be taken into account and stored in the grid plate metrology mapping. In the case of disturbances due to dust particles or any other contamination, the measurement information may also be used as input for a cleaning action.

The above calibration may be performed along a line. Also, multiple lines may be followed, e.g. in order to scan and calibrate a plane. Thereto, a 2 dimensional field of data may be made. A two dimensional filter may be applied on the data so as to remove unwanted effects of glitches, errors outside the to be calibrated spatial frequency range. The filter (in a one dimensional case as well as in a two dimensional case) may include a spatial bandwidth in a spatial frequency range to be calibrated. Thereby, effects outside the bandwidth in which the to be calibrated deviations may be found may be removed or at least reduced to diminish an effect thereof on the calibration process.

Thus, as an example, when measuring a high-frequency map containing encoder grid plate errors, the substrate stage is moved under the gridmap with high velocity. By using a low controller bandwidth, the high-frequency components in the gridmap cannot be tracked by the stage. The measured deviation of the encoder positions from the setpoint are then assumed to be caused by grid plate errors. By scanning a number of times in Y direction with a varying X position, and scanning in X direction with a varying Y position, a complete error map is built. The X direction and the Y direction define a plane substantially parallel to a surface of the wafer, as described above in relation to FIG. 1. By using a 2-D filtering technique, only spatial frequencies between about 1 mm and 10 mm are passed; wavelengths larger than about 10 mm and wavelengths smaller than about 1 mm are blocked. The end result is an error map of the gridplate that contains only these frequencies.

The low controller bandwidth ensures that the relevant frequencies in the gridplate are not tracked. However, the low bandwith may result in a sensitivity of the control system for a variety of possible disturbance factors, such as a slow settling behavior of the stage (in a practical example, the settling error becomes 10 µm instead of 10 nm when the bandwidth is decreased from 200 to 10 Hz). In addition, the settling behavior could become so much slower that during the constant-velocity part of the stage movement no settling occurs at all. Further, scans in positive and negative direction give different results because of e.g. amplifier or motor characteristics, or cogging effects of a long-stroke motor of the stage influencing short-stroke positioning which may result in differences between scans in opposite directions. To summarize, the low desired bandwidth for accurate measurement of grid plate errors introduces a large number of new errors that were suppressed when using the high bandwidth. These effects may partly be filtered by the 2-D bandpass filtering after obtaining the complete measurement error map, however possibly not sufficiently to create an accurate enough HF map. During operation of the lithographic apparatus (e.g. exposure of a wafer), the above phenomena are compensated by the high servo bandwidth of the control system. A plurality of possible solutions which may aid in at least reducing one or more of the above mentioned effects, is described below.

In an embodiment, when measuring the complete 2-dimensional grid plate, scans are performed in X and in Y direction. The scans in Y direction are performed at a large number of X positions, and vice versa. The newly introduced errors due to the low controller bandwidth tend to reproduce for all Y scans. Similarly, the newly introduced errors for all X scans are similar. In contrast, the grid plate errors that are to be measured do not reproduce for all X scans and all Y scans (if they would, they would have a very low spatial frequency, which is already compensated by the 'Fishbone' technique). Hence, by averaging all Y scans, a 'common' Y error signal results that is not caused by the grid plate but by the introduced controller errors resulting from the low bandwidth. By subtracting this averaged error from all individual Y scans, the remaining individual scans only contain grid plate errors and no control errors any more. The same technique can be used for all X scans. Hence, the moving of the stage may be repeated for different positions of the stage with respect to the encoder grid, wherein the signal registered is averaged for the different positions to obtain an average signal curve, and wherein the average signal curve is subtracted from the registered signals representative of the difference, the calibration being performed on a result of the subtraction. This technique may be of beneficial when real gridmap errors do not reproduce in a direction along the grid. Furthermore, peaks in the signals registered may be compared with each other, a possible fluctuation parameter being derived from the comparison, the fluctuation parameter being applied to the average signal curve before subtraction thereof from the registered signals representative of the difference. Thereby, gradual fluctuations (such as a gradient) in the peaks may be taken into account.

In an embodiment, to provide a faster settling of the movement of the stage, a bandwidth of the controller may be increased when accelerating the stage towards a constant velocity, the bandwidth of the controller being decreased upon approaching a settling of the stage to a constant velocity of the movement. A large portion of the controller error is generated during acceleration of the stage to a constant velocity. By setting a high bandwidth during this acceleration phase, the errors stay small. After reaching a constant velocity, the bandwidth may be reduced, allowing the measurement of the grid plate error. Thereby, in a practical example the settling behavior of 10 micrometers could be reduced to 10 nanometers.

In an embodiment, a plurality of movements of the stage relative to the encoder grid may be performed, the movements differing from each other in at least one of a velocity, a direction, a start position of the stage movement, a start position of a long stroke motor of the stage and an orientation of the movement the registered signals of each of the movements being averaged. With varying-velocity scans (movements), not all scans are performed with the same velocity. By using, for example, two velocities, the gridplate errors that are sought will be seen in the sensor signal with two different frequencies in a time domain. In other words, in the spatial domain the time-related controller-induced errors (e.g. settling) will be different, while the gridplate errors are the same. With varying-start-position scans, e.g. by slightly changing the scan start position, the time-related controller-induced errors will be visible in another part of the spatial map, hence allowing distinction between these two. With varying balance-mass positions, e.g. by varying the balance mass position from scan to scan, a cogging effect (which is dependent on the long-stroke motor position with respect to the balance mass) can be made to vary. Averaging the scans that are each performed with different balance mass positions allows reduction of the cogging effect on the calibration. Thus, possible effects of the long stroke motor (e.g. due to the position of the magnets of the motor relative to the coils) may be found by varying the position of the longs stroke motor for different scans to be able to discriminate position errors of the stage caused by such effects of the long stroke motor.

In an embodiment, iterative learning control may be applied to learn an error in a spatial frequency range outside a to be calibrated spatial frequency range. Thereby, iterative learning control (abbreviated as ILC) may be performed from scan (e.g. movement) to scan to iteratively learn an error correction time table. The ILC table(s) may be filtered, such that frequencies of interest in the gridplate are filtered from the ILC table(s). Otherwise, the errors having a high spatial frequency (which are to be removed by the calibration) would also be compensated In an embodiment, the movement of the stage relative to the encoder grid may be repeated after swapping stages in a dual stage lithographic apparatus. Thereby, stage-related differences in the measurements may be discriminated from other effects, which allows diminishing them in a similar way as outlined above In an embodiment, the movement may include a constant velocity movement part and an acceleration movement part, an acceleration of the stage during the acceleration movement part being slow relative to the bandwidth of the controller. By applying e.g. a smooth polynomial acceleration profile for movement of the stage, measuring may also take place during the acceleration phase, which could allow measuring a larger part of the gridmap as measuring could start closer to an edge of the grid plate. Consequently, smaller borders around the grid edges may need to be taken into account. The acceleration movement part may include a constant-force-period. A complication may be provided by the non-constant, increasing speed, which may have the effect that spatial errors in the gridmap errors result in non-constant frequencies in the sensor data. Hence, measurement may become valid as soon as a certain velocity threshold is passed.

In an embodiment, an iterative calibration may be provided by repeating the above described calibration procedure for a same movement of the stage. In a practical embodiment, each scan may e.g. be performed 20-30 times. After all scans have been performed, a calibration map may be calculated and updated. Alternatively, the calibration map may be generated based on a smaller number of scans (e.g. 5), then updated in the machine, measuring again, etc. This way, an iterative procedure is used that does not in total need more scans, however in the later stages of this process the remaining gridmap errors are small, allowing for a more reproducible servo error. In each iteration, a possibly different 2-D filtering may be applied, for example using a more accurate filtering at the expense of a larger non-usable edge. In addition, a starting point for the iteration may be formed by an 'average gridplate' because all plates are made using the same original.

In an embodiment, during the movement of the stage, an acceleration of the stage may be measured by an accelerometer, whereby a correction signal is derived from the measured acceleration, the correction signal being applied to correct the signal representative of a difference between the setpoint signal and the position of the stage prior to the calibration. Thus, an accelerometer may be added to the stage for measuring e.g. X and Y (and possibly Rz) accelerations, and an absolute position value of the stage may be calculated by e.g. a double integration of the accelerometer data (in the HF map frequency range), to be used as a reference with which the gridplate system measurement data is compared. Hence, the accelerometer acts as an independent position sensor against which the gridplate sensor data is compared.

In an embodiment, during the movement of the stage, an acceleration of the stage may be measured by an accelerometer, and an acceleration feedback may be provided to the controller, thereby providing the stage extra (virtual) mass, making it less sensitive to force disturbances while maintaining the low bandwidth position controller as described above.

In an embodiment, the signal representative of a difference between the setpoint signal and the position of the stage may be multiplied by a (band pass filtered) inverse control sensitivity of the controller, a result of the multiplication being applied for the calibration. As described above, a low stage control bandwidth may be used to provide that the stage does not respond to gridplate errors in the frequency range of interest. A stage response to gridplate errors equals $1/(1+PC)$, wherein P represents a stage transfer function of the stage and C represents a controller transfer function of the controller. With a low bandwidth, C tends to zero in the higher spatial frequency range, and hence there is a one to one relation between stage error and gridplate error. Using a larger stage controller bandwidth may be possible when the control sensitivity is taken into account. The measured sensor outputs may then be multiplied by $(1+PC)$ to compensate for the stage response. Generally, such a multiplication is difficult because $(1+PC)$ tends to infinity for low frequencies. However, a modified version of $(1+PC)$ may be used that may be correct in the frequency of interest, however approaches zero for other frequencies, e.g. $(1+PC)$ is multiplied by a bandpass filter B.

Although each of the above embodiments may be applied, combinations of two or more of the above embodiments may be applied also, whereby each embodiment may provide for an effect as described above.

It will be understood that the calibration technique described here, as well as all further refinements thereof, may be applied for a calibration in any desired degree of freedom as detected by the sensor head. The sensor head may include any suitable sensor, such as an encoder type sensor, an interferometer type sensor (e.g. to measure a distance from the sensor head towards the encoder grid), a combined encoder/interferometer, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A stage system calibration method, comprising:
   moving, in response to a setpoint signal, a stage relative to an encoder grid, a position of the stage controlled by a stage controller;
   measuring, during the moving, the position of the stage by a sensor cooperating with the encoder grid;
   registering a signal representative of a difference between the setpoint signal and the position of the stage measured by the sensor; and
   calibrating the stage system from the registered signal representative of the difference,
   wherein the bandwidth of the stage controller is increased when accelerating the stage towards a constant velocity during the moving, and the bandwidth of the stage controller is decreased upon approaching a settling of the stage to the constant velocity during the moving to at least provide a faster settling of the stage.

2. The method according to claim 1, wherein a bandwidth of the stage controller is low compared to a rate at which to be calibrated irregularities in the grid are sensed.

3. The method according to claim 1, comprising repeating the moving through the registering for at least two different movements of the stage relative to the encoder grid.

4. The method according to claim 3, comprising filtering the registered signal representative of the difference by applying a two dimensional filter, prior to the calibrating.

5. The method according to claim 4, wherein the filter comprises a spatial bandwidth in a spatial frequency range to be calibrated.

6. The method according to claim 1, comprising, prior to the calibrating, filtering the registered signal representative of the difference by applying a spatial bandwidth in a spatial frequency range to be calibrated.

7. The method according to claim 1, comprising:
   repeating the moving of the stage for different positions of the stage with respect to the encoder grid;
   averaging the registered signals for the different positions to obtain an average signal curve; and subtracting the average signal curve from the registered signals representative of the difference, the calibration being performed on a result of the subtraction.

8. The method according to claim 7, comprising comparing peaks in the registered signals, a possible fluctuation parameter being derived from the comparison, the fluctuation parameter applied to the average signal curve before subtraction thereof from the registered signals representative of the difference.

9. The method according to claim 1, comprising performing a plurality of movements of the stage relative to the encoder grid, the movements differing from each other in at least one of a velocity, a direction, a start position of the stage movement, a start position of a long stroke motor of the stage and an orientation of the movement, the registered signals of each of the movements being averaged.

10. The method according to claim 1, comprising applying an iterative learning control to learn an error in a spatial frequency range outside a to be calibrated spatial frequency range.

11. The method according to claim 1, comprising repeating the movement of the stage relative to the encoder grid after swapping stages in dual stage lithographic apparatus.

12. The method according to claim 1, wherein the movement comprises a constant velocity movement part and an acceleration movement part, an acceleration of the stage during the acceleration movement part being slow relative to the bandwidth of the stage controller.

13. The method according to claim 1, wherein an iterative calibration is provided by repeating the moving through the calibrating for a same movement of the stage.

14. The method according to claim 1, comprising measuring during the movement of the stage, an acceleration of the stage by an accelerometer; deriving a correction signal from the measured acceleration, and correcting the signal representative of a difference between the setpoint signal and the position of the stage prior to the calibration with the correction signal.

15. The method according to claim 1, comprising measuring, during the movement of the stage, an acceleration of the stage by an accelerometer, an acceleration feedback being provided to the stage controller.

16. The method according to claim 1, comprising multiplying the signal representative of a difference between the setpoint signal and the position of the stage by a band pass filtered inverse control sensitivity of the stage controller, a result of the multiplication being applied for the calibration.

17. A stage system comprising:
a movable stage;
an encoder grid and a sensor, the sensor configured to measure a position of the movable stage relative to the encoder grid; and
a controller configured to
position, in response to a setpoint signal, the movable stage relative to the encoder grid, wherein the bandwidth of the controller is increased when accelerating the movable stage towards a constant velocity, and the bandwidth of the controller is decreased upon approaching a settling of the movable stage to the constant velocity to at least provide a faster settling of the moveable stage;
register a signal representative of a difference between the setpoint signal and the position of the movable stage measured by the sensor head; and
calibrate the stage system from the registered signal representative of the difference.

18. A lithographic apparatus comprising:
an illumination system configured to condition a beam of radiation;
a patterning device support configured to hold a patterning device, the patterning device configured to pattern the beam of radiation to form a patterned beam of radiation;
a substrate support configured to support a substrate;
a projection system configured to project the patterned beam of radiation onto the substrate, and
a stage system configured to move one of the supports, the stage system including
a movable stage to hold the one of the supports;
an encoder grid and a sensor, the sensor configured to measure a position of the movable stage relative to the encoder grid; and
a controller configured to
position, in response to a setpoint signal, the movable stage relative to the encoder grid, wherein the bandwidth of the controller is increased when accelerating the movable stage towards a constant velocity, and the bandwidth of the controller is decreased upon approaching a settling of the movable stage to the constant velocity to at least provide a faster settling of the moveable stage;
register a signal representative of a difference between the setpoint signal and the position of the movable stage as measured by the sensor head; and
calibrate the stage system from the registered signal representative of the difference.

* * * * *

UNITED STATES PATENT AND TRADEMARK OFFICE
CERTIFICATE OF CORRECTION

PATENT NO. : 8,248,583 B2
APPLICATION NO. : 12/367193
DATED : August 21, 2012
INVENTOR(S) : Marinus Aart Van Den Brink It is certified that error appears in the above-identified patent and that said Letters Patent is hereby corrected as shown below:

In col. 16, claim 17, line 17, after "sensor", please delete "head".

In col. 16, claim 18, line 46, after "sensor", please delete "head".

Signed and Sealed this
Twentieth Day of November, 2012

David J. Kappos
*Director of the United States Patent and Trademark Office*